(12) United States Patent
Lin et al.

(10) Patent No.: US 7,227,242 B1
(45) Date of Patent: Jun. 5, 2007

(54) STRUCTURE AND METHOD FOR ENHANCED PERFORMANCE IN SEMICONDUCTOR SUBSTRATES

(75) Inventors: Chong Ming Lin, Sunnyvale, CA (US); Jay Denning, Redwood City, CA (US); Ho Yuan Yu, Saratoga, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 0 days.

(21) Appl. No.: 10/683,719

(22) Filed: Oct. 9, 2003

(51) Int. Cl.
  *H01L 29/06* (2006.01)
(52) U.S. Cl. ..................... 257/618; 257/622
(58) Field of Classification Search ............... 257/620, 257/622, 495, 618, 107, 619
  See application file for complete search history.

(56) References Cited

U.S. PATENT DOCUMENTS 4,524,376 A * 6/1985 Cornick ................. 257/496
5,814,532 A * 9/1998 Ichihara ................. 438/33

OTHER PUBLICATIONS

H. Ogiwara, M. Hayakawa, T. Nishimura and M. Nakaoka; "High-Frequency Induction Heating Inverter With Multi-Resonant Mode Using Newly Developed Normally-Off Type Static Induction Transistors"; Department of Electrical Engineering, Ashikaga Institute of Technology, Japan; Department of Electrical Engineering, Oita University, Japan; Department of Electrical Engineering, Kobe University, Japan; pp. 1017-1023.
J. Baliga; "Highvoltage Junction-Gate Field Effect Transistor Wth Recessed Gates"; IEEE Transactions on Electron Devices; vol. ED-29; No. 10; Oct. 1982.
J. M. C. Stork et al.; "Small Geometry Depleted Base Bipolar Transistors (BSIT)- VLSI Devices?"; IEEE Transactions on Electron Devices; vol. ED-28; No. 11; Nov. 1981.
Nishizawa et al., "Analysis of Static Characteristics of a Bipolar Mode SIT (BSIT)"; IEEE Transactions on Electron Devices; vol. ED-29; No. 11; Aug. 1982.
Caruso et al., "Performance Analysis of a Bipolar Mode FET (BMFET) With Normally off Characteristics"; IEEE Transactions on Power Electronics; vol. 3; No. 2; Apr. 1988.
Nishizawa et al.; "Fieldeffect Transistor Versus Analog Transistor (Static Induction Transistor)"; IEEE Transactions on Electron Devices; vol. ED-24; No. 4; Apr. 1975.

* cited by examiner

*Primary Examiner*—Howard Weiss
*Assistant Examiner*—(Vikki) Hoa B. Trinh
(74) *Attorney, Agent, or Firm*—Morgan, Lewis & Bockius LLP

(57) ABSTRACT

An etched substrate structure is augmented by conductive material to provide enhanced electrical and/or thermal performance. A semiconductor device substrate comprising active regions defined on a top surface is masked and etched to define a pattern of blind features in a bottom surface of the substrate. A conductive material is then deposited on the surface of the blind features. The replacement of semiconductor material with the conductive material lowers the resistance between the active elements on the top surface and the bottom surface. The blind features may be placed in proximity to parasitic bipolar transistors in order to increase immunity to latchup. During wafer processing, a pattern of grooves aligned opposite to a scribe street pattern may be etched on the wafer back side in order to facilitate the separation of individual devices.

6 Claims, 8 Drawing Sheets

STRUCTURE AND METHOD FOR ENHANCED PERFORMANCE IN SEMICONDUCTOR SUBSTRATES

FIELD OF THE INVENTION

Embodiments of the present invention relate to the field of semiconductor devices. In particular, embodiments of the present invention relate to the electrical and thermal resistances of semiconductor device substrates.

BACKGROUND ART

Prior Art FIG. 1 shows a general example of a semiconductor device 100. The semiconductor device 100 has a substrate 105 with a back side metal layer 110, a first epitaxial layer 115, and a second epitaxial layer 120. A number of active regions 125 are disposed in the second epitaxial region 120. The active regions 125 contain circuit elements such as transistors or diodes that conduct electric current and dissipate heat. Examples of transistors are bipolar junction transistors (BJTs), metal-oxide field effect transistors (MOSFETs), and junction field effect transistors (JFETs).

The back side metal layer is commonly used to provide an electrical contact (e.g., ground) to the substrate 105 and to provide a solderable surface for mounting the device. For the semiconductor device 100, there is a thermal/electrical resistance R associated with the substrate 105. For vertical power devices such as field effect transistors (FETs) that utilize layer 110 as a source contact, the resistance R can be a significant fraction of the device on resistance $R_{ds}$-on.

The resistance R can be reduced by reducing the thickness of the substrate 105. However, wafer handling considerations and electrical requirements limit the reduction in thickness that may be applied to the substrate 105 and epitaxial layer 115.

Prior Art FIG. 2A shows an example of a complementary metal-oxide semiconductor (CMOS) inverter circuit 200 fabricated on a p-type substrate 205. A p-channel field effect transistor (PFET) 215 resides in an N-well 210 and is coupled to an n-channel field effect (NFET) transistor 220. The CMOS inverter circuit 200 is a basic building block for digital logic circuits.

Prior Art FIG. 2B shows an equivalent circuit 201 that includes parasitic bipolar transistors Q1 and Q2 that are derived from the p-n junctions associated with the inverter circuit 200. During normal operation of the inverter 200 the parasitic transistors Q1 and Q2 are off. However, if a transient voltage spike or other event produces a large current through $R_{substrate}$, the voltage drop across $R_{substrate}$ will be sufficient to turn on Q2 and cause a current flow through $R_{well}$. If the voltage drop across $R_{well}$ is large enough to turn on Q1, latchup occurs wherein a self sustained low resistance path between $V_{dd}$ and GND is produced.

FIG. 2C shows 2C shows a schematic representation 202 of the substrate bulk resistance $R_{substrate}$ associated with the equivalent circuit 201 of FIG. 2B. The bulk resistance $R_{substrate}$ is distributed in the region between the N-well 210 and the NFET 220. In contrast to the resistance R of a vertical device, the resistance $R_{substrate}$ is part of a lateral current path.

Thus, in conventional semiconductor substrates there is frequently a bulk region that either contributes to undesirable resistance in operational electrical or thermal paths, or provides an additional current path with undesirable properties.

SUMMARY OF INVENTION

Accordingly, embodiments of the present invention are directed toward an etched substrate structure that may be augmented by conductive material to provide enhanced electrical and thermal performance, or aligned with die separation lines to facilitate die separation.

In an embodiment of the present invention, a semiconductor device substrate comprising active regions defined on a top surface is masked and etched to define a pattern of blind features in a bottom surface of the substrate. A conductive material is then deposited on the surface of the blind features. The replacement of semiconductor material with the conductive material lowers the resistance between the active elements on the top surface and the bottom surface.

In another embodiment of the present invention, a semiconductor device substrate comprising a circuit susceptible to latchup on a top surface is etched and metallized to reduce the substrate bulk resistance, thereby reducing the susceptibility to latchup.

In a further embodiment, a semiconductor substrate is provided with a pattern of grooves on a bottom surface. The pattern of grooves is positioned opposite to a scribe street pattern on the top side of the substrate.

BRIEF DESCRIPTION OF THE DRAWINGS

Prior Art

Prior Art

Prior Art

Prior Art

DESCRIPTION OF THE PREFERRED EMBODIMENTS

In the following detailed description of the present invention, a structure and method for enhanced performance in semiconductor substrates, numerous specific details are set forth in order to provide a thorough understanding of the present invention. However, it will be obvious to one skilled in the art that the present invention may be practiced without these specific details. In other instances well known circuits and components have not been described in detail so as not to unnecessarily obscure aspects of the present invention.

Figure 1:
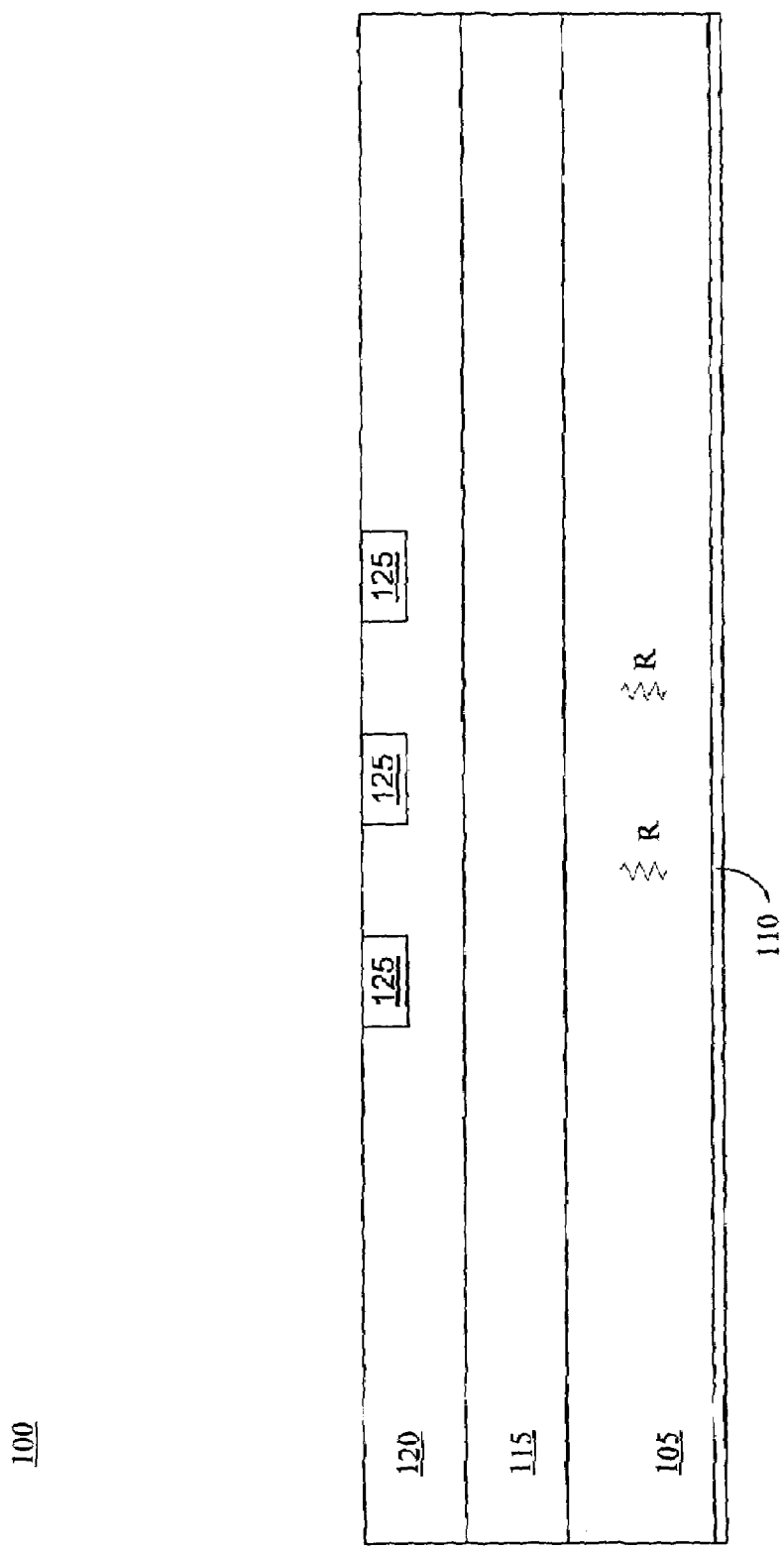
FIG. 1 shows a general schematic for thermal and electrical resistances in a semiconductor device substrate.
Figure 3A:
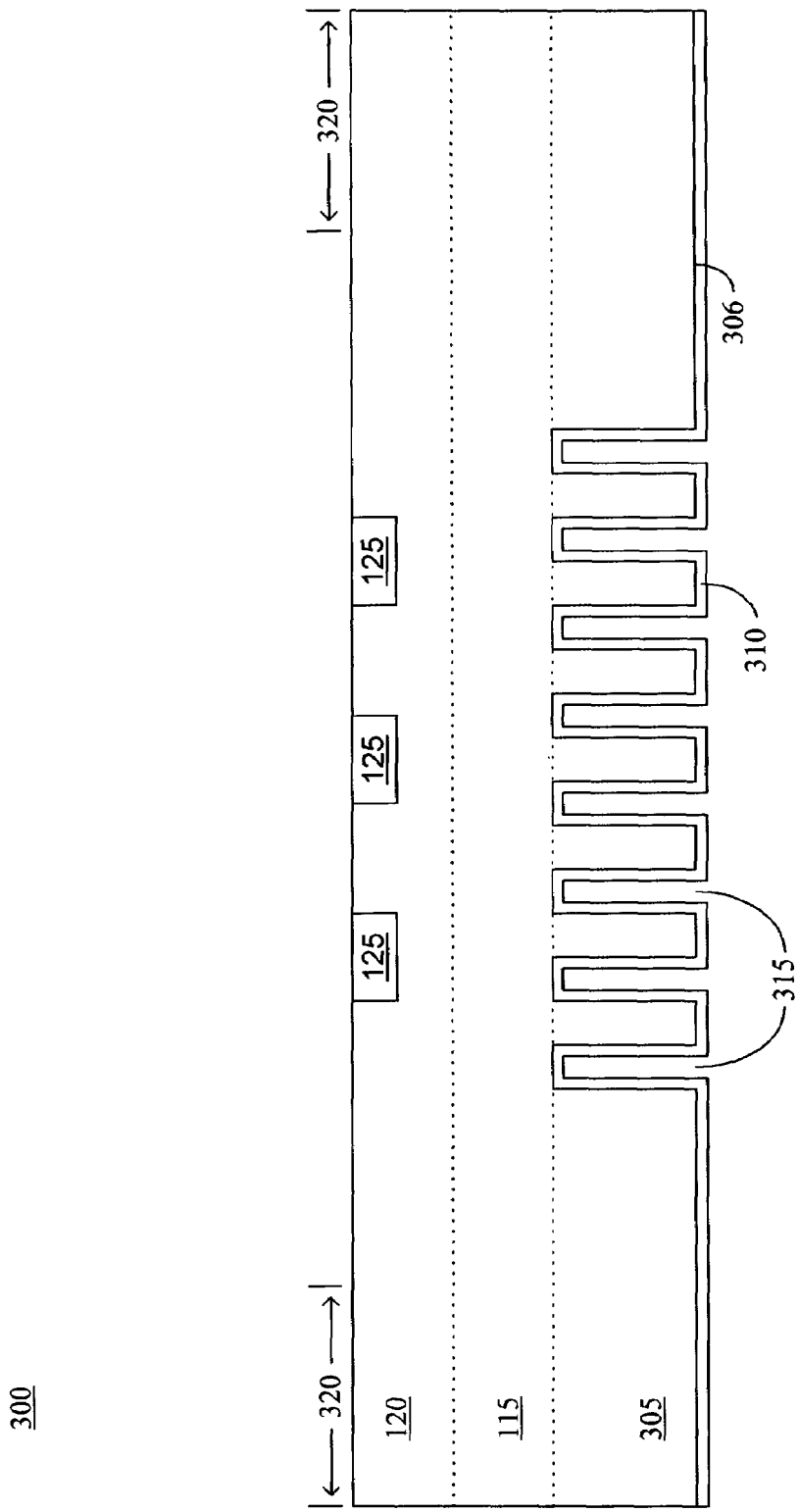
FIG. 3A shows a semiconductor device substrate with partially filled blind features in accordance with an embodiment of the present invention.

FIG. 3A shows a semiconductor device 300 in accordance with an embodiment of the present invention. The active regions 125, epitaxial layers 115 and 120 are similar to those shown in FIG. 1. However, the substrate 305 has a number of blind features 315 that are coated with a conductive layer 310.

In one embodiment, the blind features 315 are created by etching of the bottom surface 306 of the substrate 305 through a mask. The blind features 315 are preferably etched using a wet chemical etch. The depth of the blind features 315 is typically less than or equal to the thickness of the substrate 305, being equal to the thickness of the substrate only when an epitaxial layer 115 or 120 is present.

The blind features 315 may be grooves as shown, or may also be pits having a closed perimeter at the bottom surface 306 of the substrate 305. The shapes and locations of the blind features 315 may be determined by the location of the active regions 125 and their electrical and thermal characteristics.

For the device 300, the bottom surface 306 is a plane of electrical and/or thermal contact, with current or heat flowing from the active regions 125 through the substrate 305 to the conductive layer 310. The material selected for the conductive layer 310 (e.g., aluminum) has a higher electrical conductivity than the semiconductor substrate 305, and thus is able to provide a lower resistance current path, even though the conductive layer 310 may not completely fill the blind features 315.

The disparity in electrical conductivity between semiconductors and conductors is generally much larger than the disparity in thermal conductivity. For example, the difference in electrical conductivity between aluminum and silicon can be several orders of magnitude, whereas the difference in thermal conductivity is about two or three.

Although increased electrical and thermal conduction is generally desired, electrical conduction may be improved at the expense of thermal conduction in low power devices when a reliable thermal expansion match is difficult. A partially filled blind feature may improve electrical performance while degrading thermal performance.

By using a wet chemical etch and an exemplary dimension of about 10 microns, the blind features 315 may be produced at a low cost using mature processing technology. The deposition of the coating 310 may be done using evaporation, sputtering, electroplating or other deposition technique.

Semiconductor devices are frequently produced from wafers by scribing and breaking, sawing, or laser cutting. A street 320 is usually provided on a wafer to separate individual devices and provide sufficient separation of the active regions from the edge of the device. In the device 300 the blind features 315 are removed from the street 320 in order to prevent unwanted fracture propagation.

Figure 3B:
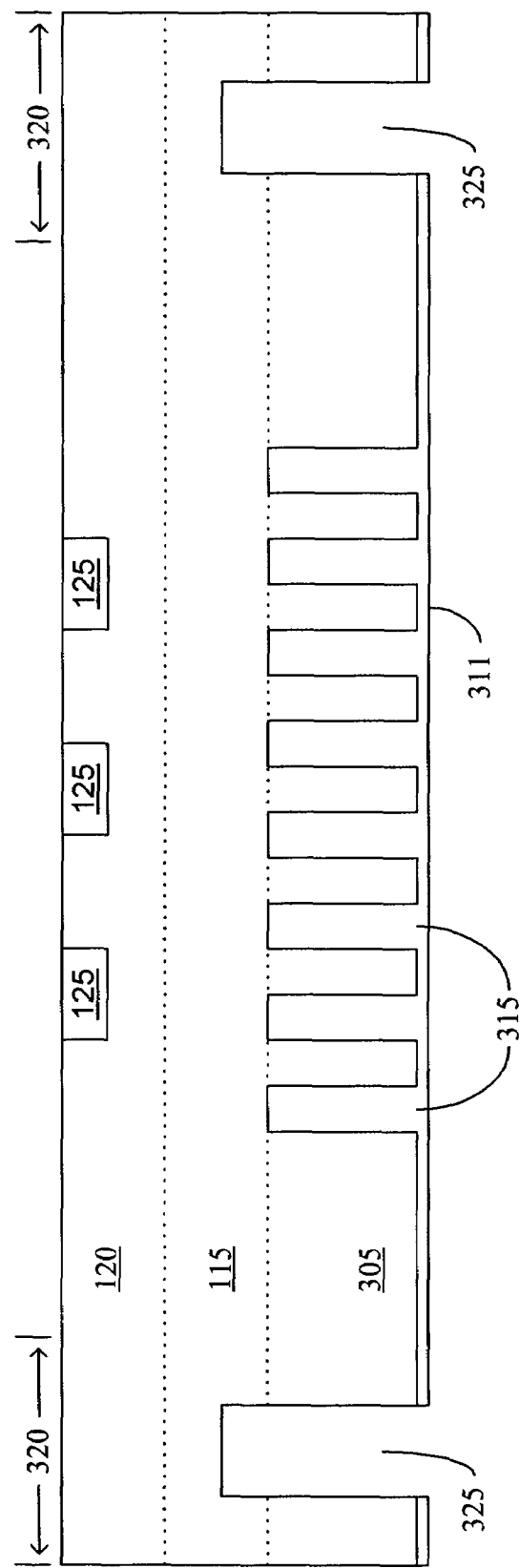
FIG. 3B shows a semiconductor device substrate with street-aligned grooves in accordance with an embodiment of the present invention.

FIG. 3B shows a semiconductor device 301 with street-aligned grooves 325 in accordance with an embodiment of the present invention. In contrast to the blind features 315, the street-aligned grooves 325 are placed under the streets 320, and are used to facilitate the separation of individual devices from a wafer. The street-aligned grooves 325 reduce the amount of material that must be removed during cutting or sawing, and also help to direct fracture propagation along scribe lines.

FIG. 3B also shows a conductive layer 311 that provides complete filling of the blind features 315. Complete filling of the blind features 315 may be done by depositing a metal or applying a filled polymer (e.g., silver filled epoxy). The use of a complete fill generally requires a closer matching of the thermal expansion characteristics of the substrate 305 and conductive layer 311 than is required between the substrate 305 and coating 310.

The street-aligned grooves 325 are generally deeper than the blind features 315, and may be partially etched in a preliminary etch step before being etched along with the blind features 315.

Figure 2A:
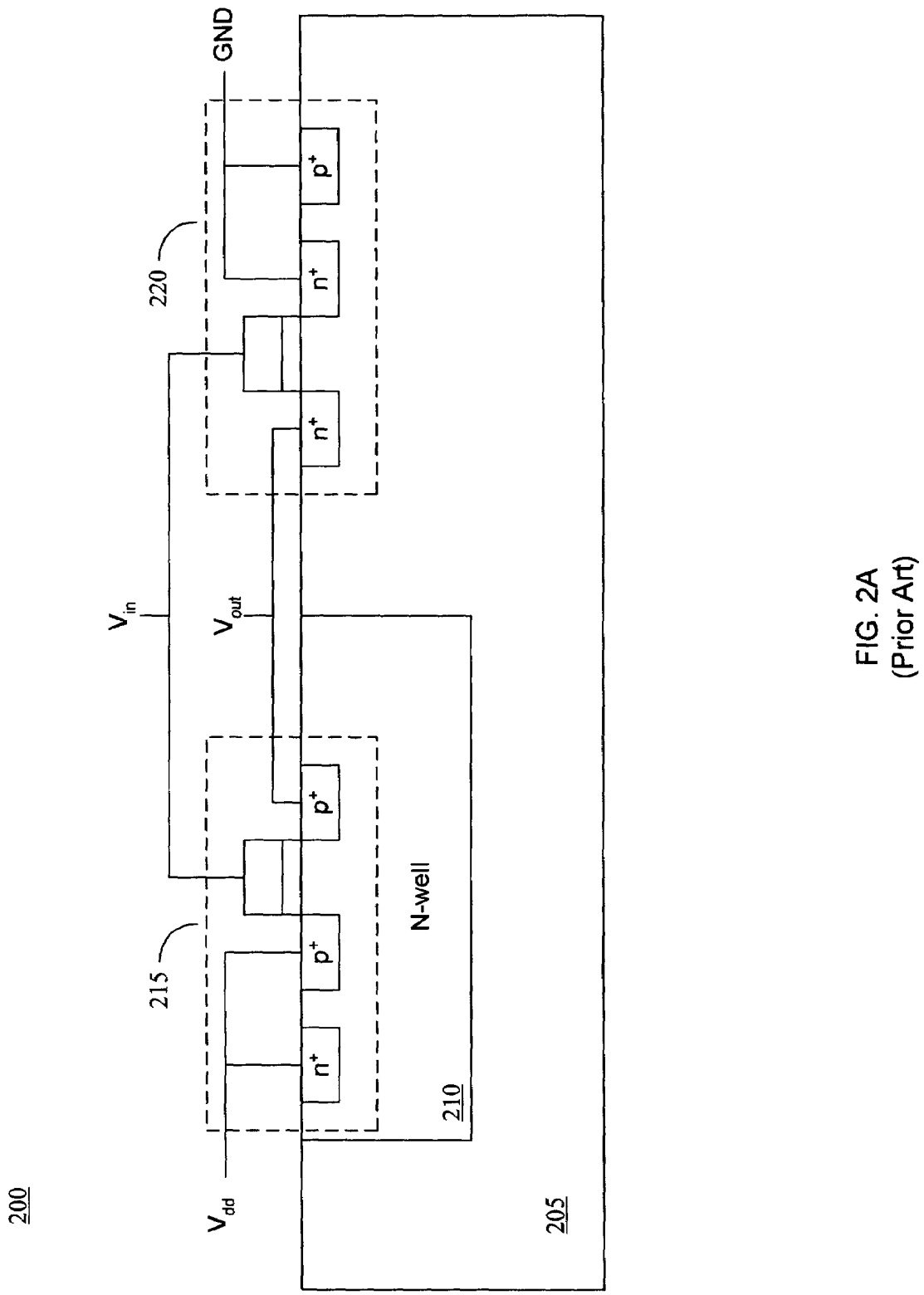
FIG. 2A shows an example of a semiconductor device that is susceptible to latchup.
Figure 2B:
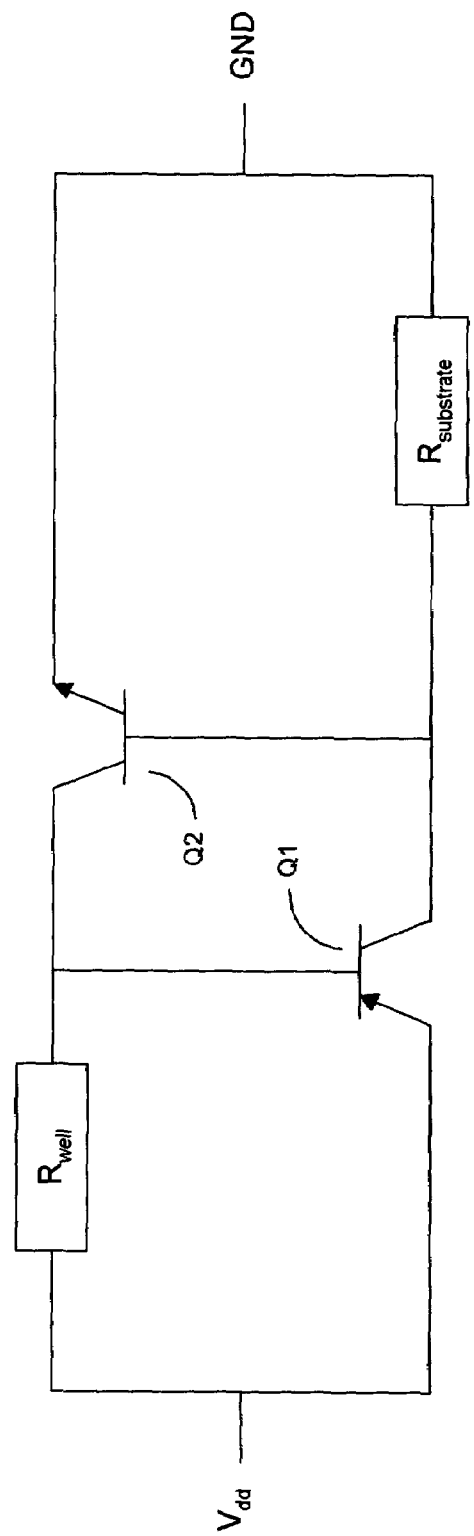
FIG. 2B shows a schematic diagram for the device of FIG. 2A.
Figure 2C:
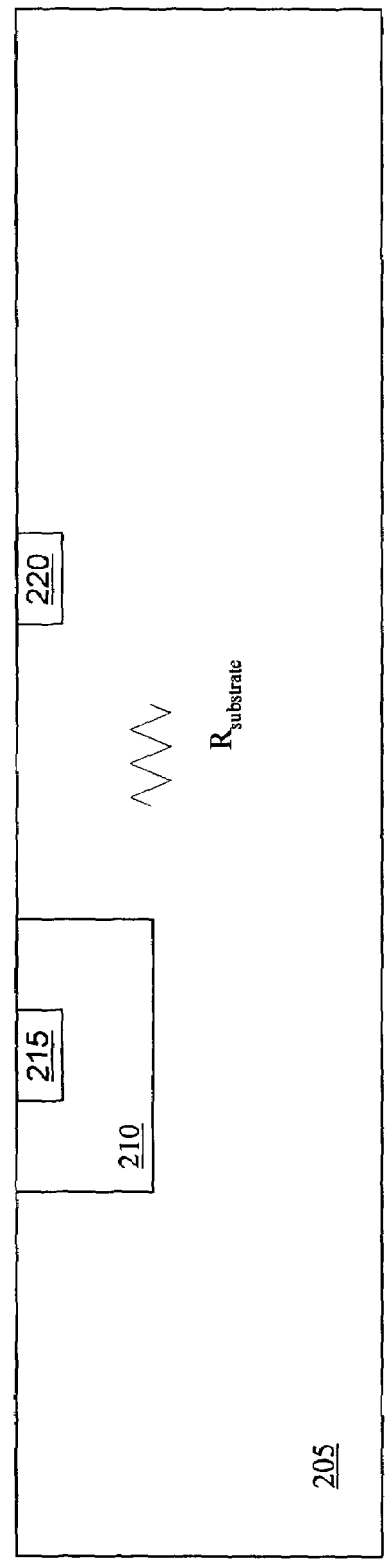
FIG. 2C shows a schematic representation of the substrate bulk resistance associated with the circuit of FIG. 2B.
Figure 4:
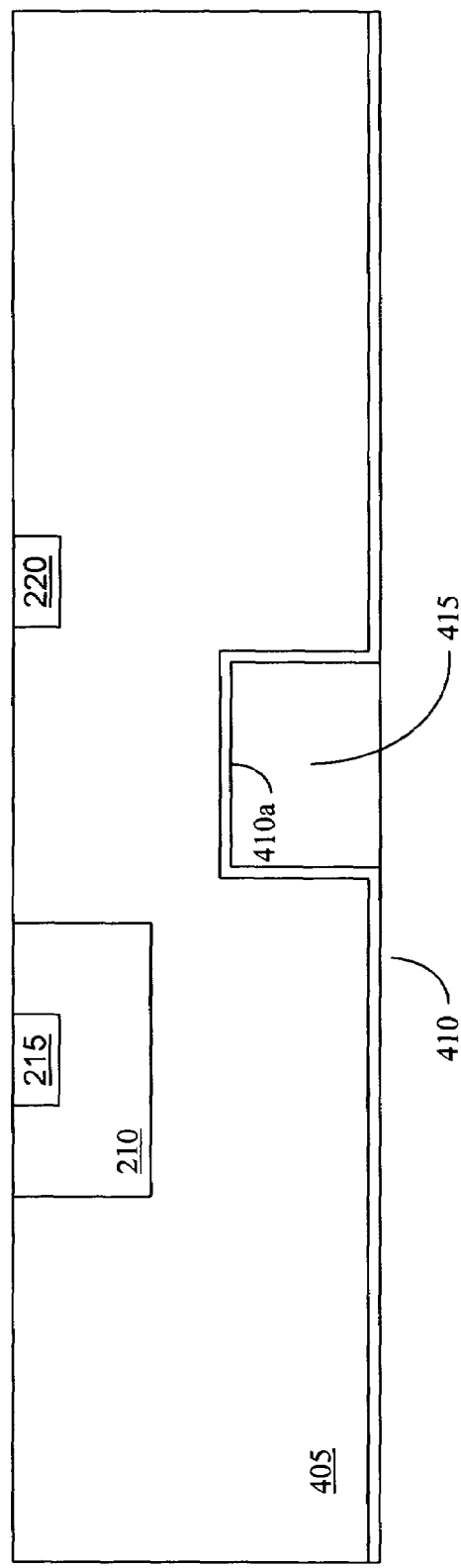
FIG. 4 shows a CMOS device with a reduced $R_{substrate}$ in accordance with an embodiment of the present invention.

FIG. 4 shows a CMOS device 400 with a reduced $R_{substrate}$ in accordance with an embodiment of the present invention. The substrate 405 of the CMOS device 400 includes an NFET 220 and an N-well 210 containing a PFET 215 similar to those shown in FIG. 2C. The substrate 405 also includes a blind feature 415 that replaces a volume of the substrate 405 that is associated with $R_{substrate}$.

The surface of the blind feature 415 has a conductive coating 410a that provides a lower net $R_{substrate}$ that increases immunity to latchup in the CMOS device 400. In general, the blind feature 415 is preferably located in proximity to a parasitic transistor in order to obtain the greatest reduction in $R_{substrate}$. The coating 410a may be made of sufficient thickness to completely fill the blind feature 415. The bottom surface of substrate 405 may also have a conductive coating 410.

Figure 5:
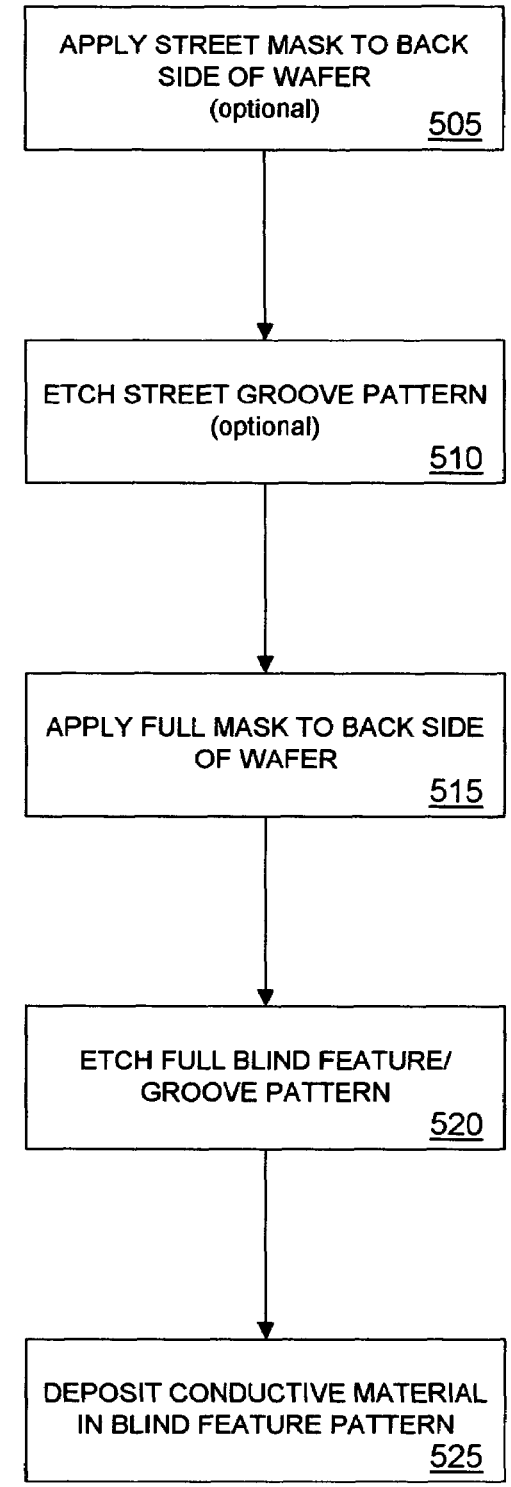
FIG. 5 shows a flow diagram for a method of decreasing the electrical resistance and/or thermal resistance of a semiconductor device substrate in accordance with an embodiment of the present invention.

FIG. 5 shows a flow diagram 500 for a fabrication method or decreasing the electrical and/or thermal resistance of a semiconductor device substrate in accordance with an embodiment of the present invention. The integrated circuit fabrication method applies to a semiconductor substrate or wafer that may comprise silicon, germanium, SiGe, or a III–V compound such as GaAs.

At step 505, a street mask is applied to the back side of the semiconductor wafer. The street mask provides openings through which a pattern of grooves may be etched opposite the scribe streets on the front side of the wafer. Step 505 is optional. The street mask may be combined with the blind feature mask for etching, with a blind feature mask being used to block out filling of the street grooves. The combined mask may be used to reduce the overall number of masks required for patterning.

At step 510, the street groove pattern is etched to a fraction of its ultimate depth. The etch is preferably performed using a wet chemical etch. Since the street groove pattern is intended to be mechanically weak to aid in separation of finished devices, the street groove pattern is typically deeper than the subsequently etched blind feature pattern.

At step 515, a full mask is applied to the back side of the wafer. The full mask has openings for the street groove pattern, if previously etched, and a pattern of blind features. At step 520, the wafer is subjected to a second etch. The second etch is also preferably a wet chemical etch.

A step 520, a conductive material is applied to the surfaces of the blind features etched in step 515. The conductive material may provide a partial fill or a complete fill of the blind features. The conductive material may be a metal or a filled polymer with an electrical conductivity or thermal conductivity that is greater than that of the semiconductor wafer.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

The invention claimed is:

1. A semiconductor device comprising:
   a semiconductor substrate comprising a top surface and a bottom surface, wherein said top surface includes a first street and a second street, wherein an inactive region is below each of said streets;
   a plurality of separate active regions formed on said top surface wherein said separate active regions are formed between said first street and said second street on said top surface, wherein each separate active region comprises at least one transistor; and
   a plurality of street grooves disposed on said bottom surface of said semiconductor substrate, wherein each street groove represents a groove formed such that the inactive region is above said groove, wherein each street groove is aligned opposite one of said first and second streets such that each area between said street groove and said street is an inactive region.

2. The semiconductor device of claim , further comprising:
   a plurality of blind features disposed in said bottom surface; and
   a material deposited on surfaces of said blind features, wherein an electrical conductivity of said material is greater than an electrical conductivity of said semiconductor substrate.

3. The semiconductor device of claim 2, wherein a thermal conductivity of said material is greater than a thermal conductivity of said semiconductor substrate.

4. The semiconductor device of claim 2, wherein said material partially fills each of the blind features.

5. The semiconductor device of claim 2, wherein said material completely fills each of the blind features.

6. The semiconductor device of claim 2, wherein said semiconductor substrate comprises a material selected from the group consisting of silicon, germanium, and III–V compounds.

* * * * *

UNITED STATES PATENT AND TRADEMARK OFFICE
CERTIFICATE OF CORRECTION

| | |
|---|---|
| PATENT NO. | : 7,227,242 B1 |
| APPLICATION NO. | : 10/683719 |
| DATED | : October 9, 2003 |
| INVENTOR(S) | : Lin et al. |

It is certified that error appears in the above-identified patent and that said Letters Patent is hereby corrected as shown below:

In the Claims:

Column 5, line 21, Claim 2 after the word "claim" and before the comma, insert --1--.

Signed and Sealed this

Fourteenth Day of August, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,227,242 B1 | Page 1 of 1 |
| APPLICATION NO. | : 10/683719 | |
| DATED | : June 5, 2007 | |
| INVENTOR(S) | : Lin et al. | |

It is certified that error appears in the above-identified patent and that said Letters Patent is hereby corrected as shown below:

<u>In the Claims</u>:

Column 5, line 21, Claim 2 after the word "claim" and before the comma, insert --1--.

This certificate supersedes Certificate of Correction issued August 14, 2007.

Signed and Sealed this

Fourth Day of September, 2007

JON W. DUDAS
*Director of the United States Patent and Trademark Office*